United States Patent [19]
Gardner et al.

[11] Patent Number: 5,827,763
[45] Date of Patent: Oct. 27, 1998

[54] METHOD OF FORMING A MULTIPLE TRANSISTOR CHANNEL DOPING USING A DUAL RESIST FABRICATION SEQUENCE

[75] Inventors: Mark I. Gardner, Cedar Creek; Fred Hause, Austin, both of Tex.

[73] Assignee: Advanced Micro Devices, Inc., Sunnyvale, Calif.

[21] Appl. No.: 791,378

[22] Filed: Jan. 30, 1997

[51] Int. Cl.$^6$ .............................................. H01L 21/8238
[52] U.S. Cl. .......................... 438/232; 438/228; 438/224; 438/199
[58] Field of Search .................................. 438/223, 224, 438/228, 229, 218, 220, 414, 232

[56] References Cited

U.S. PATENT DOCUMENTS

| | | | |
|---|---|---|---|
| 4,978,626 | 12/1990 | Poon et al. | 438/220 |
| 5,132,241 | 7/1992 | Su | 438/228 |
| 5,416,038 | 5/1995 | Hsue et al. | 438/228 |
| 5,422,301 | 6/1995 | Otsuki | 438/227 |

Primary Examiner—Tuan H. Nguyen
Attorney, Agent, or Firm—Jenkens & Gilchrist, P.C.

[57] ABSTRACT

A method of forming a multiple transistor channel doping in a semiconductor substrate utilizes a unique photoresist sequence. A pattern of a first resist in first and second locations on first and second different areas of the semiconductor substrate is formed, respectively. A pattern of a second resist is then formed on the second area, wherein the second resist covers the first resist pattern in the second location. The first resist is selected for being immune from the second resist. Ions are then implanted in the first area to form a first conductivity type well having a first multiple transistor channel doping profile. The second resist pattern is then removed and a pattern of a third resist is formed on the first area, wherein the third resist covers the first resist pattern in the first location. In addition, the first resist is selected for being immune from the third resist. Lastly, ions are implanted in the second area to form a second conductivity type well having a second multiple transistor channel doping profile. A substrate having a multiple transistor channel doping profile is also disclosed.

21 Claims, 2 Drawing Sheets

METHOD OF FORMING A MULTIPLE TRANSISTOR CHANNEL DOPING USING A DUAL RESIST FABRICATION SEQUENCE

BACKGROUND OF THE INVENTION

1. Field of the Invention

This invention relates generally to field effect transistor structures and, more particularly, to high performance MOSFET transistor structures and a method for making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents an MOS transistor or MOSFET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include $n^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{Gx}$) from the voltage at the drain ($V_{GS}-V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

Microprocessor circuits utilize FET device structures. In an effort increase performance and to increase the speed of a microprocessor circuit, the drive current of the transistor device structures incorporated therein must be increased. Typically, if the circuit is tuned for the transistor, then the faster one makes the transistor, the faster the speed of the circuit. The speed of the transistor is directly correlated with the drive current of the FET, referred to as $I_{DSAT}$. $I_{DSAT}$ is the amount of current which can be flowed through the transistor when the transistor is fully turned on. $I_{DSAT}$ depends primarily upon $V_{GS}$. The relationship between $I_{DSAT}$ and $V_{GS}$ is given by the expression $I_{DSAT}=K/2\times(V_{GS}-V_T)^2$, where K is a constant which contains a number of process parameters integrated together, and $V_T$ is the threshold voltage. From the equation, it can be seen that decreasing $V_T$ directly increases $I_{DSAT}$. As the drive current increases, the speed of the transistor increases. Simply increasing the speed of the transistor, however, may not be sufficient. For example, while the speed of the transistor depends upon the raw drive current, if the transistor lacks reliability, then the overall circuit reliability suffers. Furthermore, increasing the drive current in the transistors of an overall circuit also increases power consumption, since power equals current times voltage($P=I\times V$). However, too much power consumption in a high performance integrated circuit is not desireable.

It would thus be desireable to provide an integrated circuit including high performance transistor devices while maintaining a desired power consumption level.

SUMMARY OF THE INVENTION

It is an object of the present invention to provide a new photoresist sequence for use in the formation of a multiple transistor channel doping profile, for producing a semiconductor substrate and integrated circuit which overcome problems in the art as discussed.

In accordance with the present invention, a method of forming a multiple transistor channel doping in a semiconductor substrate includes the steps of forming a pattern of a first resist in first and second locations corresponding to selective channel regions on first and second different areas of the semiconductor substrate, respectively. A pattern of a second resist is then formed on the second area, wherein the second resist covers the first resist pattern in the second location, the first resist being immune from the second resist. Ions are then implanted in the first area to form a first conductivity type well having a first multiple transistor channel doping profile. The second resist pattern is then removed and a pattern of a third resist is formed on the first area. The third resist covers the first resist pattern in the first location, wherein the first resist is immune from the third resist. Lastly, ions are implanted in the second area to form a second conductivity type well having a second multiple transistor channel doping profile.

Further in accordance with the present invention, a semiconductor substrate having multiple transistor channel doping is formed by the method as discussed herein above. In addition, the present invention includes an integrated circuit having transistor devices fabricated on the semiconductor substrate having multiple transistor channel doping profiles.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
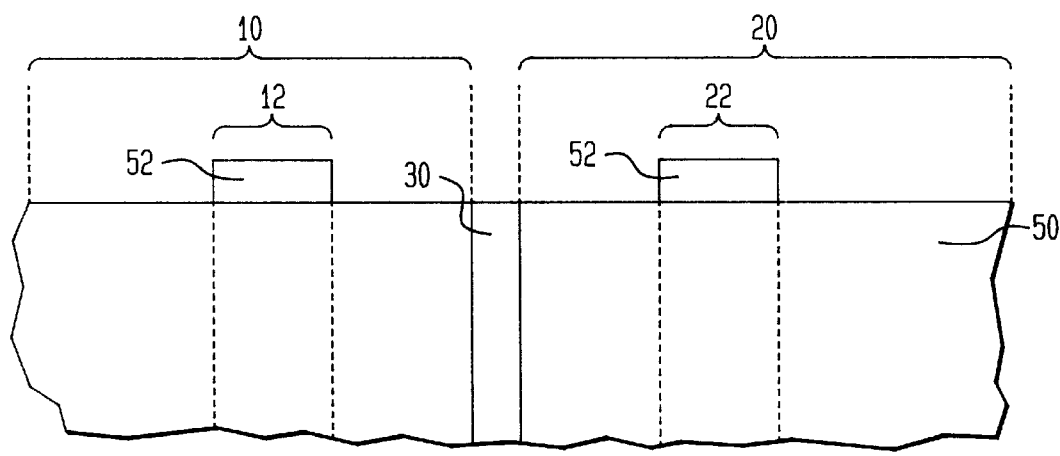
FIGS. 1–3 illustrate various steps of a method of forming a multiple transistor doping in a semiconductor substrate according to the present invention.
Figure 2:
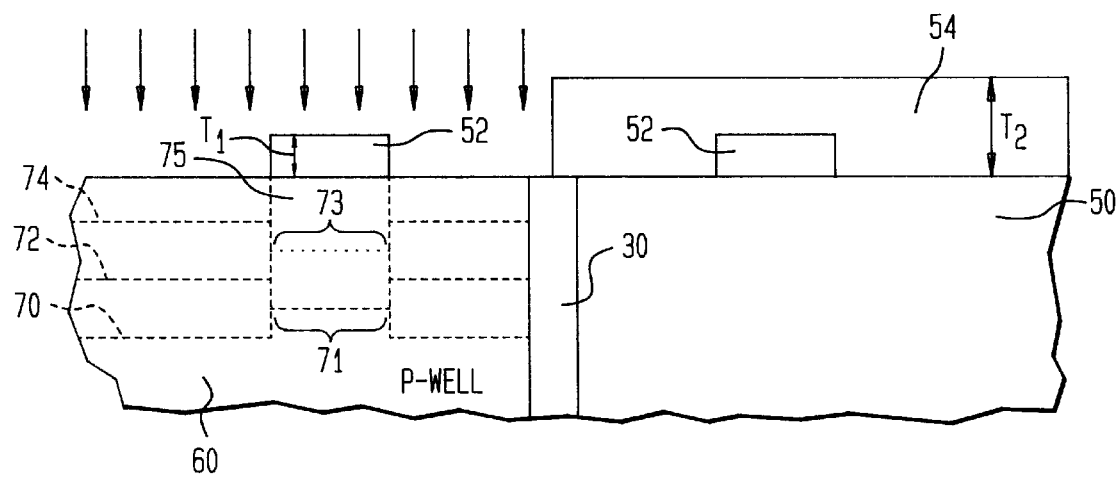

Turning now to the FIGS. 1–3, in accordance with the present invention, a method of forming a multiple transistor channel doping in a semiconductor substrate 50 shall now be described. The method in includes the steps of employing a unique photoresist sequence which combines a first resist (i.e., a negative tone resist) with conventional resist systems (e.g., a positive or negative resist). In essence, two different types of resists are used herein, such that, a first resist layer is patterned and then one or more other resist patterns are superimposed and/or taken away for making desired combinations of photoresist schemes. With the present method, it is necessary for at least two of the resists to have different removal properties. As shown in FIGS. 1 and 2, for example, a first pattern of resist 52 is defined on silicon substrate 50 and subsequently followed by a second pattern of resist 54. Resist 1 (represented by reference numeral 52) and resist 2 (represented by reference numeral 54) include any two different resists wherein whatever etching is used to remove resist 1 will not affect resist 2, and vice versa. The integrated dual resist fabrication sequence enables creation of a dual transistor channel doping formation, as shall be described in further detail herein below.

The method of forming a multiple transistor channel doping in a semiconductor substrate 50 in accordance with the present invention shall now be further described. The method includes the steps of providing a semiconductor substrate 50. Semiconductor substrate 50 is characterized by a first area or region 10 and a second area or region 20. Region 10 and region 20 may further be isolated from one another, for example, having a trench isolation 30, for example, separating the two regions. Any suitable trench isolation may be used. A pattern of a first resist 52 is formed in first and second locations 12 and 22, respectively, on first and second different areas, 10 and 20, respectively, of the semiconductor substrate 50. The first and second locations, 12 and 22, respectively, correspond to selective channel regions and define areas of the substrate for fabrication of high performance MOSFET devices, as will be discussed herein further below.

Referring now to FIG. 2, a pattern of a second resist 54 is formed on the second area 20, wherein the second resist 54 covers the first resist pattern 52 in the second location 22. As noted above, the first resist 52 is selected to be immune from or not affected by the second resist 54. Ions of a first conductivity type are then implanted in the first area 10 in a prescribed manner to form a first conductivity type well 60, further for formation of a first multiple transistor channel doping profile in substrate 50. In other words, the first conductivity well 60 is characterized as having a first multiple transistor channel doping profile. After the ion implantation step, the second resist pattern 54 is removed by any suitable removal method appropriate for removing the second resist pattern 54. Resist pattern 52 is not affected by the removal of resist pattern 54.

Figure 3:
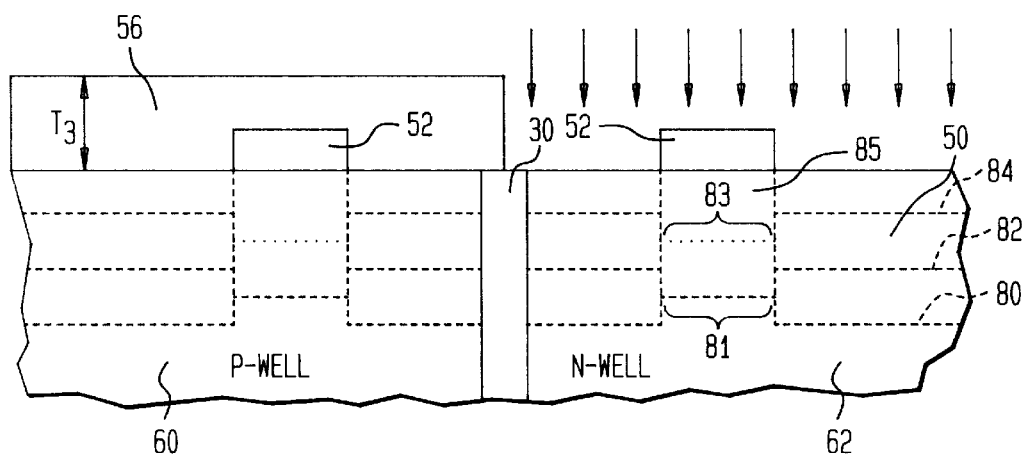

Referring now to FIG. 3, a pattern of a third resist 56 is formed on the first area 10, wherein the third resist 56 covers the first resist pattern 52 in the first location 12. As with the second resist 54, the third resist 56 is selected to be immune from or not affected by the first resist 52, or vice versa. Next, ions of a second conductivity type are implanted in the second area 20 in a prescribed manner to form a second conductivity type well 62 having a second multiple transistor channel doping profile in substrate 50. In other words, the second conductivity well 62 is characterized as having a second multiple transistor channel doping profile. After the ion implantation step, the third resist pattern 56 is removed by any suitable removal method appropriate for removing the third resist pattern 56. Resist pattern 52 is not affected by the removal of resist pattern 54.

In accordance with one embodiment of the present invention, the first resist 52 includes a negative tone resist and the second resist 54 includes a positive tone resist. In addition, the third resist 56 includes a positive tone resist. Negative tone resists and positive tone resists are known in the art, and thus not further discussed herein. In addition, the second and third resists 54 and 56, respectively, may include the same resist, or different resists.

In accordance with another embodiment of the present invention, the first resist 52 is selected to include a positive tone resist and the second resist 54 includes a negative tone resist. The third resist 56 may also include a negative tone resist. In this alternate embodiment, the second and third resists 54 and 56, respectively, may further include the same resist, or different resists.

In further discussion of the above and referring again to FIG. 2, the step of implanting ions in the first area 10 to form the first conductivity type well 60 includes implanting p-type ions. Ion implants in the first region 10 are preferably boron based implants of p-type dopants. P-type dopants are used for forming a p-well, wherein n-type MOS (NMOS) devices will be made in the p-well. The step of implanting ions in the first area 20 further includes implanting p-type ions a) at a first high energy level sufficient for forming a desired p-type well region 70, b) at a second lower energy level sufficient for forming a desired p-type punch-thru region 72, and c) at a third lowest energy level sufficient for forming a desired p-type Vt region 74. The depth of the dopant implant is mainly dependent upon a respective implant energy. For example, the first, second, and third energy levels can correspond to relative energy levels on the order of 200 KeV, 100 KeV, and 25 KeV, respectively. The energy levels are thus selected to be sufficient for forming the desired p-type well region 70, the desired p-type punch-thru region 72, and the desired p-type Vt region 74. The ion dopant concentration for the p-type implants is on the order of 1e12 to 1e13 ions/cm$^2$ for each of the respective implants.

As indicated herein above, referring still to FIG. 2, the depth of the dopant implant is mainly dependent upon a respective implant energy. Note, however, that first resist 52 is positioned in the first location 12 of region 10 during the ion implantation step. During the step of implanting ions, it is desirable to inhibit or block one or more implants in the first location 12 of region 10. In other words, the resist 52 in location 12 is used for inhibiting one or more implants in the semiconductor substrate below the resist 52. The thickness T1 of resist 52 is a controlling factor, in combination with the implant energy, for inhibiting one or more desired implants. In a first embodiment, the thickness T1 and implant energy levels are selected such that the first multiple transistor doping profile includes i) a p-type well region 70, a p-type punch-thru region 72, and a p-type Vt region 74 in portions of the semiconductor substrate not covered by the first resist 52 in region 10, and ii) an absence of the p-type Vt region (illustrated by reference numeral 75 in FIG. 2) in portions of the semiconductor substrate covered by the first resist 52 in region 10. The Vt implant does not enter the region of the p-well covered by the resist patter 52, thus forming a dual (or multiple) channel doping profile or scheme. Alternatively, in connection with the step of implanting ions, the thickness T1 of first resist pattern 52 can be selected to be of a sufficient thickness for inhibiting an ion implantation in the portion of the semiconductor substrate covered by the first resist 52 in the first area 10 (as indicated by reference numeral 73 in FIG. 2) during ion implantation at the second energy level. With respect to the latter, the formation of a p-type punch-thru region in the corresponding portion of the semiconductor substrate is prevented. In addition, in the case of the absence of the p-type punch-thru region 73, formation of the p-type Vt region (in the area indicated by reference numeral 75 of FIG. 2) is also inhibited. Note that a depth of the ion implant at the first energy level in the substrate 50 below resist 52 in region 10 is established in proportion with the thickness of first resist 52 also, as illustrated by reference numeral 71 of FIG. 2. P-well 60 thus includes a multiple channel doping profile in which at least two types of transistors can be fabricated in the p-well, each having a different channel region doping characteristic.

Referring now to FIG. 3, the step of implanting ions in the second area 20 to form the second conductivity type well 62 includes implanting n-type ions. Ion implants in the second region 20 are preferably phosphorous based implants of n-type dopants. N-type dopants are used for forming an n-well, wherein p-type MOS (PMOS) devices will be made in the n-well. Formation of the second multiple transistor doping profile is similar to the formation of the first multiple transistor doping profile with differences as discussed below. The second multiple transistor doping profile includes i) an n-type well region 80, an n-type punch-thru region 82, and an n-type Vt region 84 in portions of the semiconductor substrate 50 not covered by the first resist 52 in the second region 20 and ii) an absence of the n-type Vt region (illustrated by reference numeral 85 in FIG. 3) in portions of the semiconductor substrate 50 covered by the first resist 52 in region 20. The step of implanting ions in the second area further includes implanting n-type ions a) at a fourth high energy level sufficient for forming a desired n-type well region 80, b) at a fifth lower energy level sufficient for forming a desired n-type punch-thru region 82, and c) at a sixth lowest energy level sufficient for forming a desired n-type Vt region 84. The depth of the dopant implant is mainly dependent upon a respective implant energy. For example, the fourth, fifth, and sixth energy levels can correspond to relative energy levels on the order of 600 KeV, 300 KeV, and 75 KeV, respectively. The energy levels are thus selected to be sufficient for forming the desired n-type well region 80, the desired n-type punch-thru region 82, and the desired n-type Vt region 84. Phosphorus has a larger Bohr radius than boron by a factor of about three, thus the energy levels required are three times as large for obtaining equivalent depths of implant as the boron implants. The ion dopant concentration for the n-type implants is on the order of 1e12 to 1e13 ions/cm$^2$ for each of the respective implants.

In further connection with the step of implanting ions in region 20, similarly as mentioned above with respect to FIG. 2, the thickness of the first resist pattern 52 is also selected for inhibiting an ion implantation in a portion of the semiconductor substrate 50 covered by the first resist 52 in the second area 20 during ion implantation at the sixth energy level. As a result, the formation of an n-type Vt region is inhibited in the corresponding portion of the semiconductor substrate 50 as illustrated by reference numeral 85 of FIG. 3. The Vt implant does not enter the region of the n-well covered by the resist patter 52, thus also forming a dual (or multiple) channel doping profile or scheme. Alternatively, the thickness of the first resist pattern 52 may also be selected for inhibiting an ion implantation in a portion of the semiconductor substrate 50 covered by the first resist 52 in the second area 20 during ion implantation at the fifth energy level. In this latter instance, the formation of an n-type punch-thru region as indicated by reference numeral 83 in FIG. 3 in the corresponding portion of the semiconductor substrate 50 is prevented. In addition, in the case of the absence of the n-type punch-thru region 83, formation of the n-type Vt region (in the area indicated by reference numeral 85 of FIG. 3) is inhibited. Note that a depth of the ion implant at the fourth energy level in the substrate 50 below resist 52 in region 20 is established in proportion with the thickness of first resist 52 also, as illustrated by reference numeral 81 of FIG. 3. N-well 62 thus includes a multiple channel doping profile in which at least two types of transistors can be fabricated in the n-well, each having a different channel region doping characteristic.

Upon a completion of the second step of implanting ions as discussed with respect to FIG. 3, the substrate thus contains two multiple transistor channel doping profiles, one in the first region 10 and one in the second region 20. All of the desired dopant regions are now defined for a particular integrated circuit application. Transistors may now be fabricated in each of the two regions 10 and 20. Prior to the transistor formations, the resist patterns are removed. Resist pattern 56 is removed by any suitable removal method appropriate for removing resist 56. In addition, resist pattern 52 is removed by any suitable removal method appropriate for removing resist 52.

Figure 4:
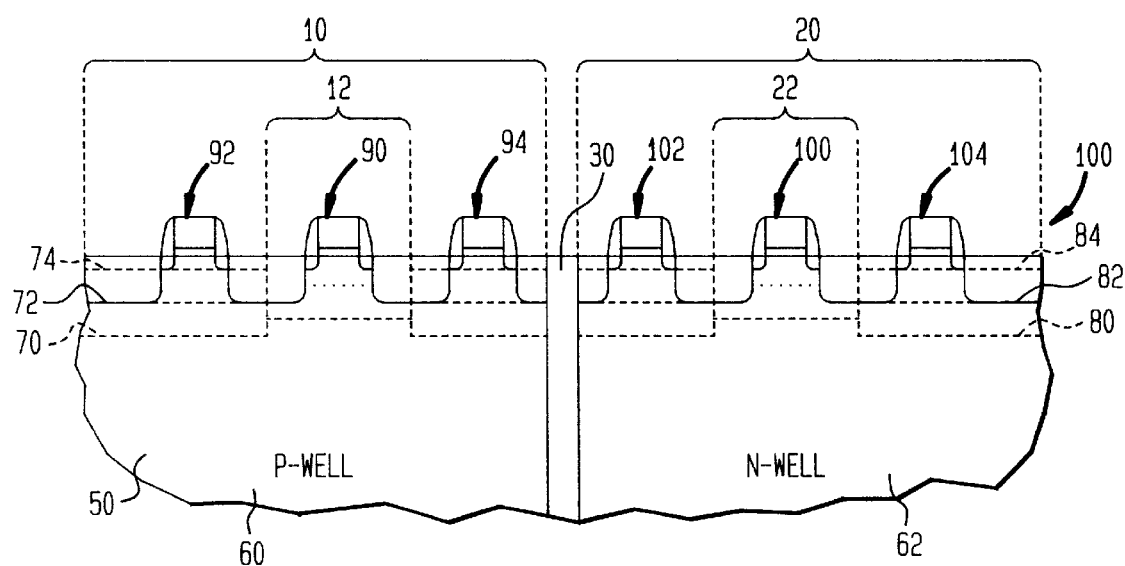
FIG. 4 illustrates an integrated circuit including transistor devices fabricated on a semiconductor substrate having multiple transistor channel doping in accordance with the present invention.

Referring now to FIG. 4, the method of the present invention further includes the steps of forming one or more transistor devices in the first conductivity type well 60 having the first multiple transistor channel doping profile.

For example, transistor 90 is formed in the location 12 of the substrate having a very low channel doping, whereas transistors 92 and 94 are formed in the region 10 of the substrate 50 having a higher channel doping. Transistor 90 is characterized by a very low doped channel region, on the order of a background doping level of substrate 50. Transistor 90 is further characterized as a very high performance transistor. In addition, the threshold voltage for transistor 90 can be on the order of 0.1 to 0.2 volts (working off of the silicon background concentration), whereas, the threshold voltage of transistors 92 and 94 (within the same well as transistor 90) can be on the order of 0.6 volts. In addition, one or more transistor devices are formed in the second conductivity type well 62 having the second multiple transistor channel doping profile. For example, transistor 100 is formed in the location 22 of the substrate having a very low channel doping, whereas transistors 102 and 104 are formed in the region 20 of the substrate 50 having a higher channel doping. Transistor 100 is characterized by a very low doped channel region, on the order of a background doping level of substrate 50 in N-well 62. Transistor 100 is further characterized as a very high performance transistor. Fabrication of the transistor devices can be accomplished using conventional techniques. Each transistor incudes source/drain regions, lightly doped drain regions, a gate oxide, a gate electrode, and sidewall spacers. Thus for each region 10 and 20, transistors having different channel doping profiles can be formed. Transistors formed in the regions containing no Vt implant are high performance transistors. In additions, the high performance transistors may also optionally be formed having no punch-thru regions, i.e., where the doping profile contains no punch-thru region.

For a better understanding the characteristics of the multiple channel doping profiles according to the present invention, a brief description of punch-thru shall now be presented with respect to an n-channel MOSFET. A positive voltage applied to the gate electrode inverts the channel of the nMOSFET and a flow of electrons occurs from the source to the drain. There is some probability of current leaking underneath the bottom of the channel. By putting a punch-thru implant (or region) in the device below the channel region, any undesirable current leakage is prevented. The punch-thru implant provides an extra protection such that the electron flow will always be defined along the surface of the transistor which contributes to the maximum switching properties of the transistor device. The punch-thru region is thus a region more highly doped than the Vt implant region, but less highly doped than the p-well deep implant. The punch-thru region prevents formation of the n-channel into the area of the punch-thru region when a positive voltage is applied to the gate electrode.

The Vt implant is a very shallow implant, i.e., next to the surface of the substrate corresponding to the gate oxide/silicon interface. Vt implant is responsible for conduction of the channel. That is, the purpose of the Vt implant is to affect tha voltage (gate voltage) at which the channel is formed in the transistor region. When applying a positive voltage to the gate electrode, the dopant in the channel determines what the threshold voltage will be of the device. The Vt implant thus establishes/alters the threshold voltage of the device. Vt is controlled by doping of the channel of the device to have a certain desired dopant concentration.

The present invention thus provides a novel method and structure for providing a multiple transistor channel doping profile within a single conductivity type well. For example, three implants occur while the the p-well region 60 is exposed, while a first resist pattern 52 covers a portion of the exposed region. In the case of the high performance transistor channel region of the multiple transistor channel doping profile of region 10, in all instances, the deepest implant (i.e., the implant at the highest energy level) goes through the first resist pattern 52 on region 10 to form a p-well doping in the area below the high performance transistor channel region. In accordance with the present invention, the Vt implant is blocked by the first resist pattern 52 in location 12. Depending upon a desired dopant profile for the high performance transistor to be fabricated, blocking of the punch-thru implant is optional in accordance with the desired properties of a resultant transistor device formed in the corresponding area of the substrate. In addition, during the step of implanting ions in the p-well region 60, no ion implantation occurs in the second region 20 as a result of the second resist 54. Resist 54 is made of sufficient thickness T2 to block any ions from being implanted into the respective underlying substrate in region 20. Similarly, implanting ions in region 20 for establishing the multiple transistor channel doping profile is complementary to that of implanting ions in region 10. Similar considerations hold true for implanting ion in region 20 as with the region 10, as discussed herein. In addition, when exposing the second region 20 to ion implantation of the n-well region 62, resist pattern 56 is of sufficient thickness T3 to block any ions from being implanted into the respective underlying substrate region 10.

In accordance with the present invention, a semiconductor substrate having multiple transistor channel doping is formed by the method as discussed herein above. In addition, the present invention includes an integrated circuit having transistor devices fabricated on the semiconductor substrate having multiple transistor channel doping profiles. The multiple transistor channel doping profiles enable the fabrication of transistor devices having different characteristics (e.g., $I_{DSAT}$) and thus facilitating an optimization of overall power consumption of an integrated circuit having high performance transistor devices.

Thus, in accordance with the present invention, a new photoresist sequence has been disclosed which combines a first resist with a second resist. A first pattern of resist is defined on a silicon substrate and subsequently followed by a second pattern of resist. The integrated dual resist fabrication sequence enables a dual transistor channel doping formation within a single conductivity type well. Within a same process flow, p-well dopings having a multiple transistor channel doping profile are created, and then the n-well dopings. Added benefits are obtained having both p-well and n-well regions fabricated for a total integration.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method of forming a multiple transistor channel doping in a semiconductor substrate, said method comprising the steps of:

forming a pattern of a first resist in first and second locations on first and second different areas of the semiconductor substrate, respectively;

forming a pattern of a second resist on the second area, wherein the second resist covers the first resist pattern in the second location, the first resist being immune from the second resist;

implanting ions in the first area to form a first conductivity type well having a first multiple transistor channel doping profile;

removing the second resist pattern;

forming a pattern of a third resist on the first area, wherein the third resist covers the first resist pattern in the first location, the first resist being immune from the third resist; and implanting ions in the second area to form a second conductivity type well having a second multiple transistor channel doping profile.

2. The method of claim 1, wherein first resist includes a negative tone resist and the second resist includes a positive tone resist.

3. The method of claim 1, wherein first resist includes a negative tone resist and the third resist includes a positive tone resist.

4. The method of claim 1, wherein first resist includes a negative tone resist and the second resist includes a positive tone resist, further wherein the third resist is the same as the second resist.

5. The method of claim 1, wherein first resist includes a positive tone resist and the second resist includes a negative tone resist.

6. The method of claim 1, wherein first resist includes a positive tone resist and the third resist includes a negative tone resist.

7. The method of claim 1, wherein first resist includes a positive tone resist and the second resist includes a negative tone resist, further wherein the third resist is the same as the second resist.

8. The method of claim 1, wherein said step of implanting ions in the first area includes implanting p-type ions, wherein the first multiple transistor doping profile includes i) a p-type well region, a p-type punch-thru region, and a p-type Vt region in portions of the semiconductor substrate not covered by the first resist and ii) an absence of the p-type Vt region in portions of the semiconductor substrate covered by the first resist; and said step of implanting ions in the second area includes implanting n-type ions, wherein the second multiple transistor doping profile includes i) an n-type well region, an n-type punch-thru region, and an n-type Vt region in portions of the semiconductor substrate not covered by the first resist and ii) an absence of the n-type Vt region in portions of the semiconductor substrate covered by the first resist.

9. The method of claim 8, wherein said step of implanting ions in the first area further includes implanting p-type ions a) at a first high energy level sufficient for forming a desired p-type well region, b) at a second lower energy level sufficient for forming a desired p-type punch-thru region, and c) at a third lowest energy level sufficient for forming a desired p-type Vt region; and said step of implanting ions in the second area further includes implanting n-type ions a) at a fourth high energy level sufficient for forming a desired n-type well region, b) at a fifth lower energy level sufficient for forming a desired n-type punch-thru region, and c) at a sixth lowest energy level sufficient for forming a desired n-type Vt region.

10. The method of claim 9, wherein forming the first resist pattern further includes making the first resist pattern of a sufficient thickness for inhibiting a) an ion implantation in a portion of the semiconductor substrate covered by the first resist in the first area during ion implantation at the third energy level, thus preventing a formation of a p-type Vt region in the corresponding portion of the semiconductor substrate, and b) an ion implantation in a portion of the semiconductor substrate covered by the first resist in the second area during ion implantation at the sixth energy level, thus preventing a formation of an n-type Vt region in the corresponding portion of the semiconductor substrate.

11. The method of claim 9, wherein forming the first resist pattern further includes making the first resist pattern of a sufficient thickness for inhibiting a) an ion implantation in a portion of the semiconductor substrate covered by the first resist in the first area during ion implantation at the second energy level, thus preventing a formation of a p-type punch-thru region in the corresponding portion of the semiconductor substrate, and b) an ion implantation in a portion of the semiconductor substrate covered by the first resist in the second area during ion implantation at the fifth energy level, thus preventing a formation of ah n-type punch-thru region in the corresponding portion of the semiconductor substrate.

12. The method of claim 8, wherein said step of implanting ions in the first area further includes implanting p-type ions a) at a first high energy level sufficient for forming a desired p-type well region, b) at a second lower energy level sufficient for forming a desired p-type punch-thru region, and c) at a third lowest energy level sufficient for forming a desired p-type Vt region.

13. The method of claim 8, wherein said step of implanting ions in the second area further includes implanting n-type ions a) at a first high energy level sufficient for forming a desired n-type well region, b) at a second lower energy level sufficient for forming a desired n-type punch-thru region, and c) at a third lowest energy level sufficient for forming a desired n-type Vt region.

14. The method of claim 1, wherein said step of implanting ions in the first area includes implanting p-type ions, wherein the first multiple transistor doping profile includes i) a p-type well region, a p-type punch-thru region, and a p-type Vt region in portions of the semiconductor substrate not covered by the first resist and ii) an absence of the p-type Vt region in portions of the semiconductor substrate covered by the first resist.

15. The method of claim 1, wherein said step of implanting ions in the second area includes implanting n-type ions, wherein the second multiple transistor doping profile includes i) an n-type well region, an n-type punch-thru region, and an n-type Vt region in portions of the semiconductor substrate not covered by the first resist and ii) an absence of the n-type Vt region in portions of the semiconductor substrate covered by the first resist.

16. The method of claim 1, wherein said step of implanting ions in the first area includes implanting p-type ions, wherein the first multiple transistor doping profile includes i) a p-type well region, a p-type punch-thru region, and a p-type Vt region in portions of the semiconductor substrate not covered by the first resist and ii) an absence of both the p-type punch-thru region and the p-type Vt region in portions of the semiconductor substrate covered by the first resist; and said step of implanting ions in the second area includes implanting n-type ions, wherein the second multiple transistor doping profile includes i) an n-type well region, an n-type punch-thru region, and an n-type Vt region in portions of the semiconductor substrate not covered by the first resist and ii) an absence of both the n-type punch-thru region and the n-type Vt region in portions of the semiconductor substrate covered by the first resist.

17. The method of claim 1, wherein said step of implanting ions in the first area includes implanting p-type ions, wherein the first multiple transistor doping profile includes i) a p-type well region, a p-type punch-thru region, and a p-type Vt region in portions of the semiconductor substrate not covered by the first resist and ii) an absence of both the p-type punch-thru region and the p-type Vt region in portions of the semiconductor substrate covered by the first resist.

18. The method of claim 1, wherein said step of implanting ions in the second area includes implanting n-type ions, wherein the second multiple transistor doping profile includes i) an n-type well region, an n-type punch-thru region, and an n-type Vt region in portions of the semiconductor substrate not covered by the first resist and ii) an absence of both the n-type punch-thru region and the n-type Vt region in portions of the semiconductor substrate covered by the first resist.

19. The method of claim 1, further comprising the steps of:

forming one or more transistor devices in the first conductivity type well having the first multiple transistor channel doping profile; and forming one or more transistor devices in the second conductivity type well having the second multiple transistor channel doping profile.

20. The method of claim 1, further comprising the step of:

forming one or more transistor devices in the first conductivity type well having the first multiple transistor channel doping profile.

21. The method of claim 1, further comprising the step of:

forming one or more transistor devices in the second conductivity type well having the second multiple transistor channel doping profile.

* * * * *

UNITED STATES PATENT AND TRADEMARK OFFICE
CERTIFICATE OF CORRECTION

PATENT NO.    : 5,827,763
DATED         : October 27, 1998
INVENTOR(S)   : Gardner, et al.

It is certified that error appears in the above-identified patent and that said Letters Patent is hereby corrected as shown below:

Column 7:
Line 36, replace "additions" with --addition--

Column 10:
Line 40, replace "ah" with --an--

Column 11:
Line 31, replace "area includes" with --area [to form the first conductivity type well] includes--

Column 12:
Line 7, replace "area includes" with --area [to form the second conductivity type well] includes--

Signed and Sealed this

Nineteenth Day of June, 2001

*Attest:*

*Attesting Officer*

NICHOLAS P. GODICI
*Acting Director of the United States Patent and Trademark Office*